United States Patent
Lim et al.

(10) Patent No.: US 11,521,850 B2
(45) Date of Patent: Dec. 6, 2022

(54) METHOD FOR MANUFACTURING SEMICONDUCTOR DEVICE AND SEMICONDUCTOR DEVICE USING THE SAME

(71) Applicants: SAMSUNG DISPLAY CO., LTD, Yongin-si (KR); YONSEI UNIVERSITY, UNIVERSITY-INDUSTRY FOUNDATION (UIF), Seoul (KR)

(72) Inventors: Jun Hyung Lim, Seoul (KR); Hyung Jun Kim, Seoul (KR); Sun Hee Lee, Seoul (KR); Seung Gi Seo, Seoul (KR); Whang Je Woo, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/440,740

(22) Filed: Jun. 13, 2019

(65) Prior Publication Data
US 2020/0058488 A1 Feb. 20, 2020

(30) Foreign Application Priority Data

Aug. 17, 2018 (KR) ........................ 10-2018-0096142

(51) Int. Cl.
*H01L 21/02* (2006.01)
*H01L 29/66* (2006.01)
(Continued)

(52) U.S. Cl.
CPC .... *H01L 21/0228* (2013.01); *H01L 21/02178* (2013.01); *H01L 21/02205* (2013.01);
(Continued)

(58) Field of Classification Search
None
See application file for complete search history.

(56) References Cited

U.S. PATENT DOCUMENTS

2008/0203460 A1* 8/2008 Colonna ................. C23C 16/02
257/315
2012/0104381 A1  5/2012 Shieh et al.
(Continued)

FOREIGN PATENT DOCUMENTS

| KR | 10-0874399 | 12/2008 |
| KR | 10-0996884 | 11/2010 |
| KR | 10-2016-0111343 | 9/2016 |

OTHER PUBLICATIONS

Han Liu, The integration of high-k dielectric on two-dimensional crystals by atomic layer deposition, Applied Physics Letters, 100, 152115 (2012).
(Continued)

*Primary Examiner* — Ali Naraghi
(74) *Attorney, Agent, or Firm* — F. Chau & Associates, LLC

(57) ABSTRACT

A method for manufacturing a semiconductor device according to an, exemplary embodiment of the present disclosure includes: forming a semiconductor layer on a substrate in a chamber; and forming a semiconductor layer on a substrate in a chamber. Forming the insulation layer includes: (a) injecting precursors that include a metal into a surface of the semiconductor layer; (b) removing precursors that are not adsorbed; (c) injecting reactants onto the surface of the semiconductor layer; and (d) removing residual reactants. The semiconductor layer includes a semiconductor material that has a layered structure.

13 Claims, 19 Drawing Sheets

(51) Int. Cl.
*H01L 29/49* (2006.01)
*H01L 29/24* (2006.01)
*H01L 29/786* (2006.01)
*H01L 29/16* (2006.01)

(52) U.S. Cl.
CPC .... *H01L 21/02274* (2013.01); *H01L 29/4908* (2013.01); *H01L 29/66045* (2013.01); *H01L 29/66969* (2013.01); *H01L 29/1606* (2013.01); *H01L 29/24* (2013.01); *H01L 29/786* (2013.01); *H01L 29/78648* (2013.01)

(56) References Cited

U.S. PATENT DOCUMENTS

| | | | |
|---|---|---|---|
| 2014/0353166 A1* | 12/2014 | Iezzi | B01J 35/004 |
| | | | 205/638 |
| 2016/0172189 A1* | 6/2016 | Tapily | H01L 21/02296 |
| | | | 438/778 |
| 2017/0098717 A1* | 4/2017 | Yeh | H01L 27/1203 |
| 2018/0158670 A1* | 6/2018 | Kwak | H01L 29/517 |
| 2019/0393105 A1* | 12/2019 | Cho | G03F 7/70608 |

OTHER PUBLICATIONS

Geim et al., Van der Waals heterostructures, Nature, 499, 419-423, (2013).

\* cited by examiner 1 um

METHOD FOR MANUFACTURING SEMICONDUCTOR DEVICE AND SEMICONDUCTOR DEVICE USING THE SAME

CROSS-REFERENCE TO RELATED APPLICATION

This application claims priority under 35 U.S.C. § 119 from, and the benefit of, Korean Patent Application No. 10-2018-0096142, filed in the Korean Intellectual Property Office on Aug. 17, 2018, the contents of which are herein incorporated by reference in their entirety.

BACKGROUND

(a) Technical Field

Embodiments of the present disclosure are directed to a method for manufacturing a semiconductor device and a semiconductor device using the same, and more particularly, to a method for manufacturing a semiconductor device that forms a uniform insulation layer on a semiconductor layer by using an atomic layer deposition (ALD) method, and a semiconductor device manufactured therefrom.

(b) Discussion of the Related Art

A semiconductor material that has a layered structure is flexible and transparent, and is thus attracting attention as a next-generation semiconductor material. In this case, a thin film, such as an insulation layer, is uniformly formed on a nanometer-stale semiconductor layer.

Atomic layer deposition is a method by which one or more reactants are sequentially injected into a reaction chamber and a thin film is deposited by atomic layer units by adsorption of each reactant. After precursors are adsorbed on the substrate surface, a thin film is formed by surface reaction between other reactants and surface particles.

SUMMARY

Embodiments of the present disclosure can provide a method for manufacturing a semiconductor device, which can assure uniformity in an insulation layer by increasing an injection pressure of precursors in a atomic deposition process for forming the insulation layer on a semiconductor layer, while saving process time and process cost and a semiconductor device manufactured by using the same.

A method for manufacturing a semiconductor device according to an exemplary embodiment of the present disclosure includes: forming a semiconductor layer on a substrate in a chamber; and forming a semiconductor layer on a substrate in a chamber; and wherein the forming the insulation layer includes: (a) injecting precursors that include a metal into a surface of the semiconductor layer; (b) removing precursors that are not adsorbed; (c) injecting reactants onto the surface of the semiconductor layer; and (d) removing residual reactants, wherein the semiconductor layer includes a semiconductor material that has a layered structure.

The semiconductor material may include at least one of a transition metal dichalcogenide (TMDC), graphene, or black phosphorous. The TMDC has a chemical formula of $MX_2$, where M is one of Mo, W, Zr, and Re, and X is one of S, Se, and Te.

The precursors may be injected at a pressure from about 0.01 Torr to about 100 Torr.

The insulation layer comprises at least one of an oxide represented by one of $M^1_xO_a$ or $M^1_xM^2_yO_a$, a nitride represented by $M^1_xN_b$, or an oxynitride represented by $M^1_xO_aN_b$. In this case, $M^1$ and $M^2$ are metals, and x>0, y>0, a>0, and b>0.

The insulation layer may include at least one of $Al_2O_3$, $ZrO_2$, $HfO_2$, $Y_2O_3$, $La_2O_3$, $Ta_2O$, $Ta_2O_5$, $MgO$, $ZnO$, $TiO_2$, $Nb_2O_5$, $SiO_2$, TiN, SiN, HfON, SiON, or STO ($SrTiO_3$).

The insulation layer may have a thickness from about 0.5 nm to about 4 nm.

The insulation layer may include at least one atomic layer.

The precursor may include the same metal as the metal included in the insulation layer.

The precursor may include at least one of $AlCl_3$, $AlMe_3$ (tri-methyl aluminum (TMA)), $AlMe_2Cl$, $AlMe_2OiPr$, $AlEt_3$, $Al(OnPr)_3$, $Me_3N:AlH_3$, $AlMe_2H$, $Me_2EtN:AlH_3$, $ZrCl_4$, $ZrI_4$, $ZrCp_2Cl_2$, $Zr(OiPr)_2(dmae(Dimethylethanolamine))_2$, $Zr(OtBu)_4$, $Zr(NMe_2)_4$, $HfCl_4$, $HfI_4$, $HfCl_2[N(SiMe_3)_2]_2$, $Hf(OtBu)_4$, $Hf(OtBu)_2(mmp)_2$, $Hf(mmp)_4$, $Hf(ONEt_2)_4$, $Hf(NMe_2)_4$, $Hf(NO_3)_4$, $YCp_3$, $Y(CpMe)_3$, $Y(thd)_3$, $La(thd)_3$, $La[N(SiMe_3)_2]_3$, $TaF_5$, $TaCl_5$, $TaI_5$, $Ta(OEt)_5$, $Ta(OEt)_4$(dmae), $Ta(NMe_2)_5$, $Ta(NMe_2)_5$, $Ta(NEt)(NEt_2)_3$, $Ta(NEt_2)_5$, $Ta(NtBu)(tBu_2pz)_3$, $Ta(NtBu)(iPrAMD)_2NMe_2$, $MgCp_2$, $Mg(thd)_2$, $ZnCl_2$, $ZnMe_2$, $ZnEt_2$, $Zn(OAc)_2$, $TiCl_4$, $TiI_4$, $Ti(OMe)_4$, $Ti(OiPr)_4$, $SiCl_4$, $SiCl_3H$, $SiCl_2H_2$, $Si(OEt)_4$, HMDSh(Hexamethylenediamine Thiol), $Si(NCO)_4$, $MeOSi(NCO)_3$, $Si_2Cl_6$, and $SiH_4$.

The semiconductor layer may have a thickness of less than about 1 nm.

The reactant may be an oxidizer.

Step(a) may include adsorbing a metal of the precursor to the surface of the semiconductor layer, and step (c) may include forming the insulation layer on the surface of the semiconductor layer from a reaction between the metal of the precursor and the reactant.

A method for manufacturing a semiconductor device according to an exemplary embodiment of the present disclosure includes: forming a semiconductor layer on a substrate in a chamber; and forming an insulation layer on the semiconductor layer, wherein forming the insulation layer includes: (a) injecting precursors that include a metal into a surface of the semiconductor layer; (b) removing precursors that are not adsorbed; (c) injecting reactants onto the surface of the semiconductor layer; and (d) removing residual reactants, wherein a density of the precursors adsorbed to the surface of the semiconductor layer is increased by increasing an injection pressure of the precursors, wherein precursors are injected at a pressure from about 0.1 Torr to about 10 Torr.

The semiconductor layer may include at least one of a transition metal dichaleogenide (TMDC) having a layered structure, graphene, or black phosphorous.

A surface roughness of a surface where the semiconductor layer contacts the insulation layer is from about 2 nm to 3.2 nm, and the surface roughness may be calculated by calculating a plurality of absolute values of vertical heights from a center line of n curved lines on the surface, calculating a mean value of squares of the plurality of absolute values, and taking a positive square root of the mean value.

The insulation layer may include at least one of $Al_2O_3$, $ZrO_2$, $HfO_2$, $Y_2O_3$, $La_2O_3$, $Ta_2O$, $Ta_2O_5$, $MgO$, $ZnO$, $TiO_2$, $Nb_2O_5$, $SiO_2$, TiN, SiN, HfON, SiON, or STO ($SrTiO_3$).

The precursor may include at least one of $AlCl_3$, $AlMe_3$ (tri-methyl aluminum (TMA)), $AlMe_2Cl$, $AlMe_2OiPr$, $AlEt_3$, $Al(OnPr)_3$, $Me_3N:AlH_3$, $AlMe_2H$, $Me_2EtN:AlH_3$, $ZrCl_4$, $ZrI_4$, $ZrCp_2Cl_2$, $Zr(OiPr)_2(dmae(Dimethylethanolamine))_2$, $Zr(OtBu)_4$, $Zr(NMe_2)_4$, $HfCl_4$, $HfI_4$, $HfCl_2[N(SiMe_3)_2]_2$, $Hf(OtBu)_4$, $Hf(OtBu)_2(mmp)_2$, $Hf(mmp)_4$, $Hf(ONEt_2)_4$, $Hf(NMe_2)_4$, $Hf(NO_3)_4$, $YCp_3$, $Y(CpMe)_3$, $Y(thd)_3$, $La(thd)_3$, $La[N(SiMe_3)_2]_3$, $TaF_5$, $TaCl_5$, $TaI_5$, $Ta(OEt)_5$, $Ta(OEt)_4$ (dmae), $Ta(NMe_2)_5$, $Ta(NMe_2)_5$, $Ta(NEt)(NEt_2)_3$, $Ta(NEt_2)_5$, $Ta(NtBu)$ $(tBu_2pz)_3$, $Ta(NtBu)(iPrAMD)_2NMe_2$, $MgCp_2$, $Mg(thd)_2$, $ZnCl_2$, $ZnMe_2$, $ZnEt_2$, $Zn(OAc)_2$, $TiCl_4$, $TiI_4$, $Ti(OMe)_4$, $Ti(OiPr)_4$, $SiCl_4$, $SiCl_3H$, $SiCl_2H_2$, $Si(OEt)_4$, HMDSh(Hexamethylenediamine Thiol), $Si(NCO)_4$, $MeOSi(NCO)_3$, $Si_2Cl_6$, and $SiH_4$.

A semiconductor device according to an exemplary embodiment of the present disclosure includes: a substrate; a semiconductor layer disposed on the substrate; and an insulation layer disposed on the semiconductor layer, wherein the semiconductor layer includes a semiconductor material that has a layered structure, a surface roughness of a surface where the semiconductor layer contacts the insulation layer is from about 2 nm to 3.2 nm, and the surface roughness is calculated by calculating a plurality of absolute values of vertical heights from a center line of n curved lines on the surface, calculating a mean value of squares of the plurality of absolute values, and taking a positive square root of the mean value.

The semiconductor layer may include at least one of a transition metal dichalcogenide (TMDC) having a layered structure, graphene, or black phosphorous, the TDMC has a chemical formula of $MX_2$, where M is one of Mo, W, Zr, or Re and X is one of S, Se, or Te, and the insulation layer may include at least one of $Al_2O_3$, $ZrO_2$, $HfO_2$, $Y_2O_3$, $La_2O_3$, $Ta_2O$, $Ta_2O_5$, MgO, ZnO, $TiO_2$, $Nb_2O_5$, $SiO_2$, TiN, SiN, HfON, SiON, or STO ($SrTiO_3$).

The semiconductor may have a thickness of less than about 0.6 nm, and the insulation layer may have a thickness of from about 0.5 nm to about 3.5 nm.

According to a method for manufacturing a semiconductor device according to the present disclosure, uniformity of an insulation layer formed by atomic layer deposition on a semiconductor layer can be improved by increasing the injection pressure of the precursor. In addition, it is possible to uniformly deposit the insulation layer using fewer cycles, thus shortening the process time and process cost.

DETAILED DESCRIPTION OF EXEMPLARY EMBODIMENTS

Figure 1:
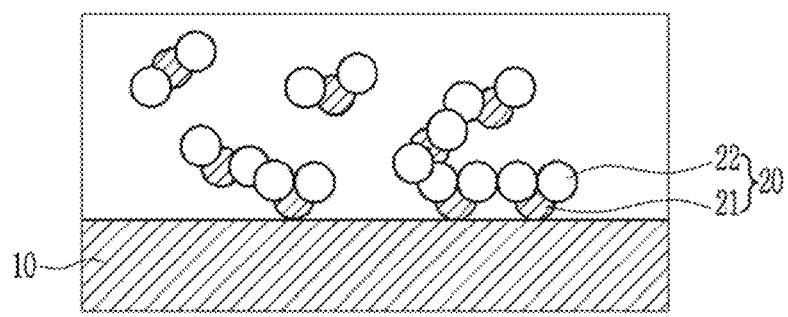
FIG. 1, FIG. 2, FIG. 3, FIG. 4, and FIG. 5 are cross-sectional views that illustrate a method for manufacturing a semiconductor device according to an exemplary embodiment.

Embodiments of present disclosure will be described more fully hereinafter with reference to the accompanying drawings, in which exemplary embodiments of the disclosure are shown. As those skilled in the art would realize, exemplary embodiments may be modified in various different ways, all without departing from the spirit or scope of the present disclosure.

The drawings and description are to be regarded as illustrative in nature and not restrictive. Like reference numerals may designate like elements throughout the specification.

Since the size and the thickness of each configuration shown in the drawings are arbitrarily indicated for better understanding and ease of description, the present disclosure is not limited to as shown in the drawings, and the thickness of layers, films, panels, regions, etc., may be exaggerated for clarity.

It will lie understood that when an element such as a layer, film, region, or substrate is referred to as being "on" another element, it can be directly on the other element or intervening elements may also be present.

Hereinafter, a method for manufacturing a semiconductor element according to an exemplary embodiment will be described with reference to FIG. 1 to FIG. 4. FIG. 1, FIG. 2, FIG. 3, and FIG. 4 are cross-sectional views that illustrate a method for manufacturing a semiconductor device according to an exemplary embodiment.

Referring to FIG. 1, according to an exemplary embodiment, a substrate that includes a semiconductor layer 10 is disposed in a chamber, and then precursors 20 for forming an insulation layer are injected onto the semiconductor layer 10. During insertion of the precursors 20, metal elements 21 of the precursors 20 are adsorbed and thus combine with a surface of the semiconductor layer 10. In this case, some of the precursors 20 may be present without being adsorbed into the surface of the semiconductor layer 10.

The semiconductor layer 10 according to an exemplary embodiment includes a semiconductor that has a layered structure. For example, the semiconductor layer 10 includes at least one of a transition metal dichalcogenide (TMDC), graphene, or black phosphorous.

The TMDC can be represented by a chemical formula $MX_2$. In the chemical formula, M is one selected from Mo, W, Zr, or Re, and X is one selected from S, Se, or Te. For example, the chemical formula can be $MoS_2$ or $WSe_2$.

The precursors 20 according to an exemplary embodiment include metal elements 21 and at least one ligand 22. The metal elements 21 are one selected from Al, Zr, Hf, V, La, Ta, Mg, Zn, Ti, or Si, but embodiments are not limited thereto.

The precursor 20 may, for example, include at least one of $AlC_3$, $AlMe_3$ (tri-methyl aluminum (TMA)), $AlMe_2Cl$, $AlMe_2OiPr$, $AlEt_3$, $Al(OnPr)_3$, $Me_3N:AlH_3$, $AlMe_2H$, $Me_2EtN:AlH_3$, $ZrCl_4$, $ZrI_4$, $ZrCp_2Cl_2$, $Zr(OiPr)_2(dmae(Dimethylethanolamine))_2$, $Zr(OtBu)_4$, $Zr(NMe_2)_4$, $HfCl_4$, $HfI_4$, $HfCl_2[N(SiMe_3)_2]_2$, $Hf(OtBu)_4$, $Hf(OtBu)_2(mmp)_2$, $Hf(mmp)_4$, $Hf(ONEt_2)_4$, $Hf(NMe_2)_4$, $Hf(NO_3)_4$, $YCp_3$, $Y(CpMe)_3$, $Y(thd)_3$, $La(thd)_3$, $La[N(SiMe_3)_2]_3$, $TaF_5$, $TaCl_5$, $TaI_5$, $Ta(OEt)_5$, $Ta(OEt)_4(dmae)$, $Ta(NMe_2)_5$, $Ta(NMe_2)_5$, $Ta(NEt)(NEt_2)_3$, $Ta(NEt_2)_5$, $Ta(NtBu)$ $(tBu_2pz)_3$, $Ta(NtBu)(iPrAMD)_2NMe_2$, $MgCp_2$, $Mg(thd)_2$, $ZnCl_2$, $ZnMe_2$, $ZnEt_2$, $Zn(OAc)_2$, $TiCl_4$, $TiI_4$, $Ti(OMe)_4$, $Ti(OiPr)_4$, $SiCl_4$, $SiCl_3H$, $SiCl_2H_2$, $Si(OEt)_4$, HMDSh(Hexamethylenediamine Thiol), $Si(NCO)_4$, $MeOSi(NCO)_3$, $Si_2Cl_6$, and $SiH_4$.

In this case, OiPr is O-i-Pr wherein i-Pr is an isopropyl group —$CH(CH_3)_2$, OnPr is a n-propoxide (O"Pr), Cp is cyclopentadienyl ($C_5H_5$-xRx), Ot may be ethoxy, tert-butoxy, tert-penoxy, and etc., mmp is 2,2,6,6-tetramethyl heptane-3,5-dionate, Nt may be collectively referred to as amido, such as ethylmethylamido (NEtMe), dimethylamido (MMe2), diethylamido (NEt2), tBu is tert-butoxy, pz is pyrazolato, AMD is tetrakis (N,N'-dimethylacetamidinate), and Ac is acetylacetonate.

In this case, according to an exemplary embodiment, by increasing an insertion pressure of the precursor 20, the number of precursors 20 adsorbed to the semiconductor 10 through the metal elements 21 of the precursor 20 can be increased. Due to the increased number of precursors 20, deposition of an insulation layer, which will be described below, can be induced over a wider area of the surface of the semiconductor layer 10, and uniformity of the insulation layer can be assured.

According to an exemplary embodiment, an injection pressure of the precursors 20 has a range from about 0.01 Torr to about 100 Torr, and depending on an embodiment, the range may reach from about 0.1 Torr to about 10 Torr. The injection pressure of the precursors 20 will be described in detail below with reference to FIG. 15 to FIG. 19.

Next, according to an exemplary embodiment, an inert gas is injected into the chamber. The inert gas includes at least one of Ar, $N_2$, or a mixed gas thereof. The injected inert gas is used to remove from the chamber any precursors 20 that are not adsorbed to the surface of the semiconductor layer 10 and any impurities in the chamber.

Figure 2:
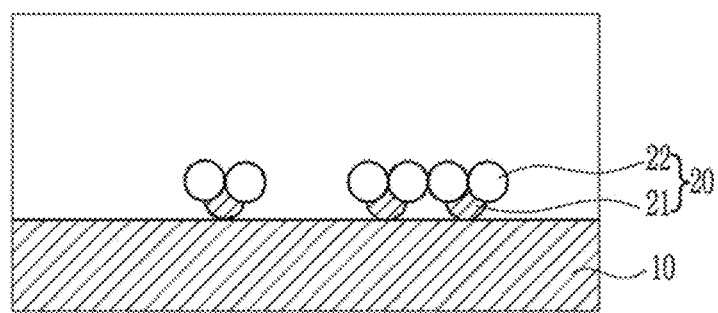

Then, according to an exemplary embodiment, as shown in FIG. 2, the precursors 20 combined with the semiconductor layer 10 remain on the semiconductor layer 10. In this case, the inert gas still remains in the chamber.

Figure 3:
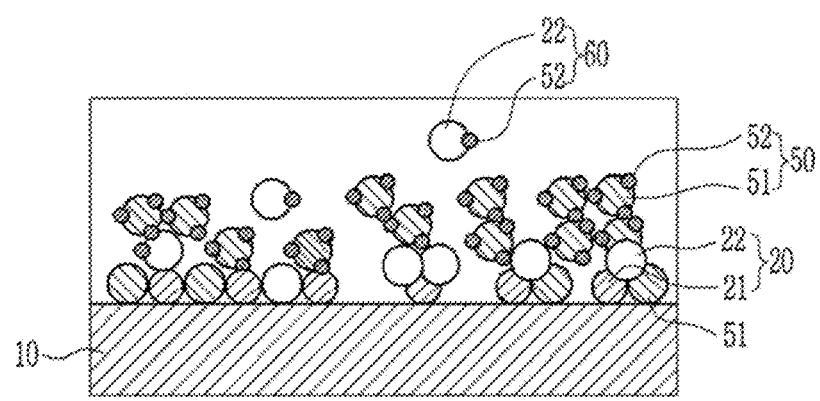

Subsequently, according to an exemplary embodiment, as shown in FIG. 3, a reactant 50 that includes a first element 51 and a second element 52 is injected into tire chamber. The reactant 50 chemically reacts with the precursors 20 that are adsorbed to the surface of the semiconductor layer 10.

Specifically, according to an exemplary embodiment, part of the ligand 22 coupled to the precursor 20 separates, and the metal element 21 of the precursor 20 and the first element 51 of the reactant 50 react with each other. In addition, the ligand 22 of tire precursor 20 and the second element 52 of the reactant 50 chemically react with each other such that a reaction product 60 may be formed.

In this case, according to an exemplary embodiment, the reactant 50 is an oxidizer that includes at least one of $H_2O$, $O_2$, or $O_3$. In addition, the reactant 50 includes at least one of an $O_2$ plasma, an $NH_3$ plasma, $N_2$ or an $H_2$ plasma, or $NH_3$ gas, but embodiments are not limited thereto. The first element 51 and the second element 52 in the reactant 50 may be the same as or different from each other. The reactant 50 assists nucleation of the precursor 20 adsorbed to the semiconductor layer 10.

Figure 4:
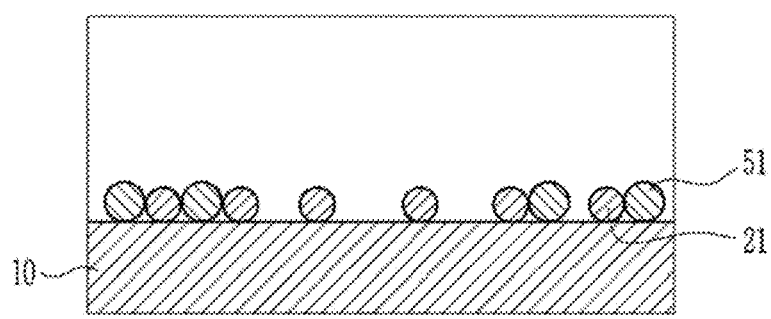

Next, according to an exemplary embodiment, unreacted reactants 50 and reaction products 60 are removed from the chamber using an inert gas such as Ar or $N_2$. Then, as shown in FIG. 4, only the metal elements 21 and the first elements 51 that are adsorbed to the surface of the semiconductor layer 10 remain. In this case, the inert gas may still remain in the chamber.

Figure 5:
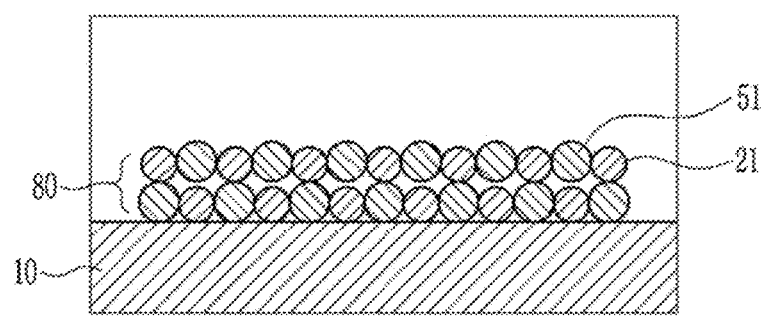

Next, referring to FIG. 5, according to an exemplary embodiment, a uniform insulation layer 80 is formed by iteratively performing (a) injection of the precursors 20 of FIG. 1, (b) removal of the un-adsorbed precursors 20 of FIG. 2, (c) injection of the reactant 50 of FIG. 3, and (d) removal of any a residual reactants 50 of FIG. 4. The iterative performance from (a) to (d) is one cycle of an ALD method, and the insulation layer 80 having a desired thickness can be formed by repeating the cycle at least once.

According to an exemplary embodiment, the insulation layer 80 is a thin film that has a thickness from about 0.5 nm to about 4 nm, depending on a deposition region of the surface of the semiconductor layer 10.

In FIG. 5, according to an exemplary embodiment, the insulation layer 80 includes two atomic layers, but embodiments are not limited thereto. The insulation layer 80 includes one or more atomic layers. Alternatively, the insulation layer 80 includes a plurality of atomic layers, each including a different material.

According to an exemplary embodiment, the insulation layer 80 is an oxide, such as one of $M^1_xO_a$ or $M^1_xM^2_yO_a$, a nitride such as $M^1_xN_b$, or an oxynitride such as $M^1_xO_aN_b$. In this case, x>0, y>0, a>0, and b>0 are satisfied.

According to an exemplary embodiment, the insulation layer 80 includes, for example, at least one of $Al_2O_3$, $ZrO_2$, $HfO_2$, $Y_2O_3$, $La_2O_3$, $Ta_2O$, $Ta_2O_5$, MgO, ZnO, $TiO_2$, $Nb_2O_5$, $SiO_2$, TiN, SiN, HfON, SiON, or STO ($SrTiO_3$). The materials form a thin film using an ALD method.

In an exemplary embodiment, the above-stated precursor 20 includes the same metal as the insulation layer 80. That is, when the insulation layer 80 has a chemical formula such as $M^1O_a$, $M^1_xM^2_yO_a$, or $M^1O_aN_b$, the first metal 21 of the precursor 20 includes a metal, i.e., $M^1$ or $M^2$, included in the insulation layer 80. The precursor 20 functions as a metal source of the insulation layer 80, which induces adsorption of the insulation layer 80 to the surface of the semiconductor layer 10.

According to an exemplary embodiment, uniformity of the insulation layer 80 is expressed by the surface roughness ($R_q$) of the surface of the semiconductor layer 10 on which the insulation layer 80 is deposited. A relationship between the insulation layer 80 uniformity and the surface roughness $R_q$ will be described in detail below with reference to FIG. 15 to FIG. 19.

In an above-stated exemplary embodiment, the precursor 20 and the reactant 50 are injected at an amount from about 1 sccm to about 500 sccm. In addition, in a method for manufacturing the semiconductor device according to an exemplary embodiment steps (a) to (d) are carried out at a temperature from about 100° C. to about 600° C. Depending on the insulation layer 80 material to be deposited, steps (a) to (d) are carried out at a temperature from about 300° C. to about 500° C. The above-stated injection gas amounts and the process performance temperatures are not limited, and can vary in other embodiments of the present disclosure.

Hereinbelow, a method for manufacturing a semiconductor device according to an exemplary embodiment will be described with reference to FIG. 6 to FIG. 10. FIG. 6, FIG. 7, FIG. 8, FIG. 9, and FIG. 10 are cross-sectional views that illustrate a method for manufacturing a semiconductor device according to an exemplary embodiment. In an exemplary embodiment of FIG. 6 to FIG. 10, an insulation layer includes $Al_2O_3$ and a precursor uses $AlMe_3$ (tri-methyl aluminum; TMA), and an exemplary embodiment of FIG. 1 to FIG. 5 will now be described in more detail. Hereinafter, only parts that differ from the exemplary embodiment of FIG. 1 to FIG. 5 will be described, and portions of the descriptions that are omitted are the same as those of an above-described exemplary embodiment.

Figure 6:
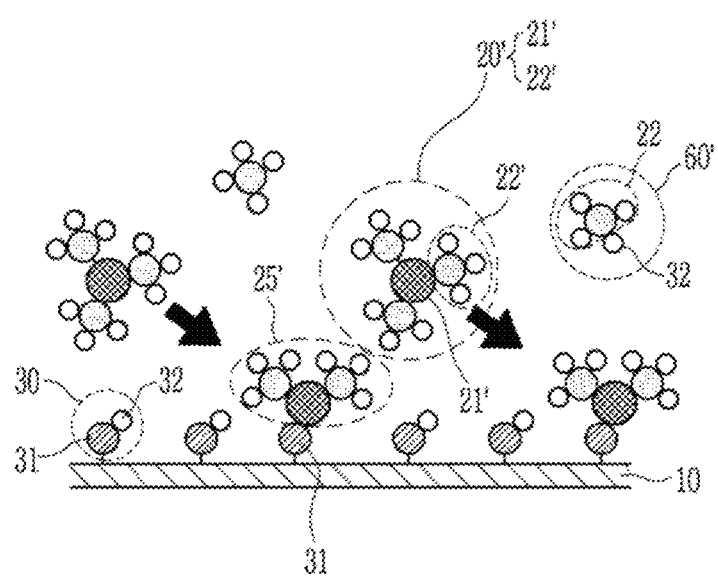
FIG. 6, FIG. 7, FIG. 8, FIG. 9, and FIG. 10 are cross-sectional views that illustrate a method for manufacturing a semiconductor device according to an exemplary embodiment.

Referring to FIG. 6, according to an exemplary embodiment, precursors $AlMe_3$ (TMA) 20', each including an Al atom 21' and a methyl group —$CH_3$ 22' as a ligand, are injected into a chamber. The injected $AlMe_3$ 20' reacts with a hydroxy group —OH 30 at a surface of a semiconductor layer 10. The hydroxy group —OH 30 includes an oxygen ion 31 and a hydrogen ion 32.

Specifically, according to an exemplary embodiment, a precursor AlMe$_3$ 25' from which one methyl group is detached combines with the oxygen ion 31 of the hydroxyl group at the surface of the semiconductor layer 10 and is adsorbed to the surface of the semiconductor layer 10. In addition, the detached methyl group 22' of the precursor AlMe$_3$ 20' chemically reacts with the hydrogen ion 32 of the hydroxyl group 30 at the surface of the semiconductor layer to from methane 60', a reaction product. A chemical reaction equation for this reaction is Chemical Formula 1.

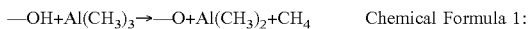

$$—OH+Al(CH_3)_3 \rightarrow —O+Al(CH_3)_2+CH_4 \quad \text{Chemical Formula 1:}$$

In this case, a density of the precursor AlMe$_3$ 25' adsorbed to the surface of the semiconductor layer 10 is increased by increasing an injection pressure of the precursors AlMe$_3$ 20'. That is, the number of precursors AlMe$_3$ 20' adsorbed to the surface of the semiconductor layer 10 increases and thus an insulation layer manufactured therefrom can be uniformly formed.

Next, according to an exemplary embodiment, an inert gas such as Ar or N$_2$ is injected into the chamber to remove those remaining precursors AlMe$_3$ (TMA) 20' that are not adsorbed to the surface of the semiconductor layer 10, and impurities such as the reaction product CH$_4$ 60'.

Figure 7:
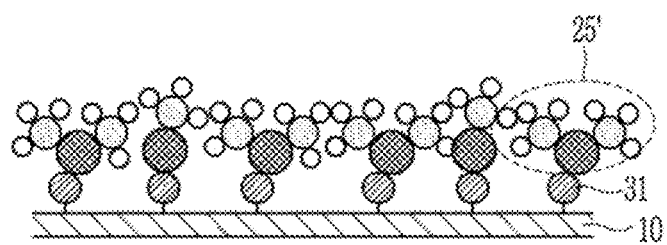

Then, according to an exemplary embodiment, as shown in FIG. 7, only portions of the precursors AlMe$_3$ 25', combined with the oxygen ions 31 on the surface of the semiconductor layer 10, remain on the semiconductor layer 10.

Figure 8:
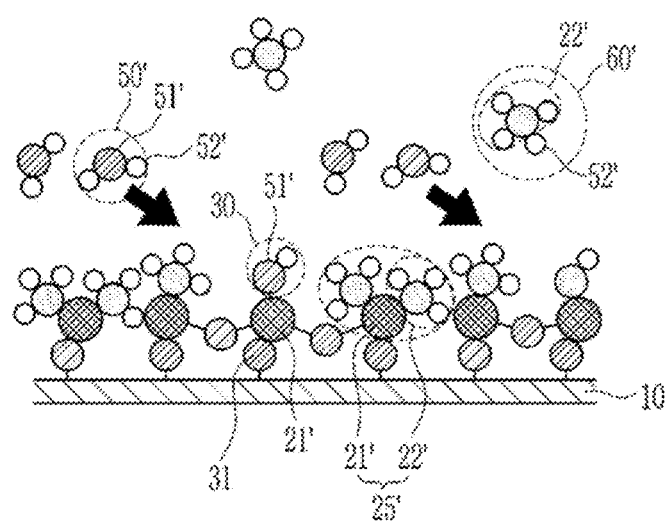

Next, according to an exemplary embodiment, referring to FIG. 8, a reactant H$_2$O 50' that includes oxygen (O) 51' and hydrogen (H) 52' is injected into the chamber. The injected reactant H$_2$O 50' reacts with a precursor 25' adsorbed to the surface of the semiconductor layer 10. In this case, the precursor 25' includes a compound where at least one methyl group 22' separates from the Al element 21'.

Specifically, according to an exemplary embodiment, the methyl group 22' separates from the precursor 25', and the Al 21' of the precursor 25' and the oxygen 51' of the reactant H$_2$O 50' chemically react with each other such that the hydroxy group 30 combines with the Al 21'. In addition, according to an exemplary embodiment, the methyl group 22' separated from the precursor 25' chemically reacts with the hydrogen 52' of the reactant H$_2$O 50' to form a reaction product 60'. The reaction product 60 may be CH$_4$, CH$_3$ or C$_2$H$_6$. A chemical reaction equation for this reaction is Chemical Formula 2.

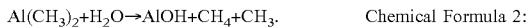

$$Al(CH_3)_2+H_2O \rightarrow AlOH+CH_4+CH_3. \quad \text{Chemical Formula 2:}$$

Next, the reactant H$_2$O 50', which does not chemically react, and the reaction product CH$_4$ 60' are removed from the chamber by injecting an inert gas such as Ar or N$_2$ into the chamber.

Figure 9:
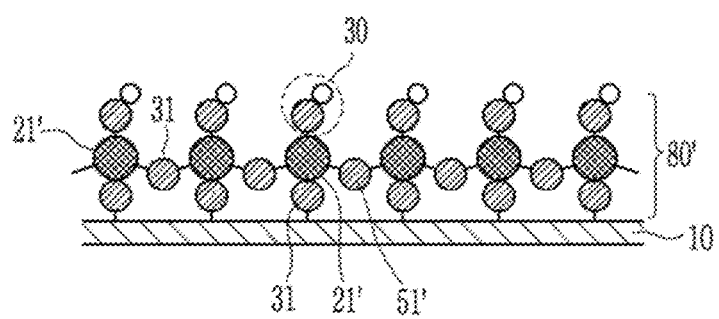

Then, according to an exemplary embodiment, as shown in FIG. 9, an insulation layer 80' is formed that includes the precursor Al element 21' combined with the oxygen 31 at the surface of the semiconductor layer 10, the oxygen 51' and the hydroxyl group 30.

According to an exemplary embodiment, the injection of the precursor AlMe$_3$ 20' of FIG. 6, the removal of the precursor AlMe$_3$ 20' of FIG. 7, and the injection of the reactant H$_2$O 50' of FIG. 8 are iteratively carried out such that a uniform Al$_2$O$_3$ insulation layer 80 can be formed on the semiconductor layer 10, as shown in FIG. 9.

The reaction that forms the Al$_2$O$_3$ insulation layer 80' using the above-described ALD method can be expressed by the reaction equation of Chemical Formula 3. In this case, H$_2$ which is an example of the reaction product, is not shown in FIG. 9.

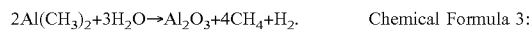

$$2Al(CH_3)_2+3H_2O \rightarrow Al_2O_3+4CH_4+H_2. \quad \text{Chemical Formula 3:}$$

Figure 10:
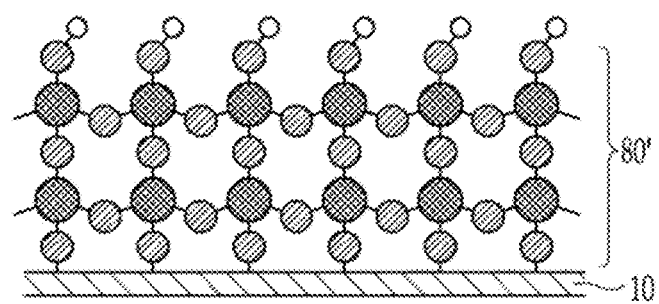

Referring to FIG. 10, according to an exemplary embodiment, the Al$_2$O$_3$ insulation layer 80' can be formed to a desired thickness by iteratively performing one cycle more than a predetermined number of times. In FIG. 10, the Al$_2$O$_3$ insulation layer 80' includes two Al$_2$O$_3$ atom layers, but embodiments are not limited thereto. The Al$_2$O$_3$ insulation layer 80' may include one or a plurality of Al$_2$O$_3$ molecular layers.

According to an exemplary embodiment, the Al$_2$O$_3$ insulation layer 80' is a thin film having a thickness of from about 0.5 nm to about 3.5 nm, depending on a deposition region in the surface of the semiconductor layer 10.

In addition, according to an exemplary embodiment, the Al$_2$O$_3$ insulation layer 80' may be a single layer or have a plurality of layers. In an exemplary embodiment of FIG. 6 to FIG. 10, the insulation layer includes Al$_2$O$_3$, but embodiments are not limited thereto. The insulation layer may include a plurality of layers, each including a different material. For example, the insulation layer 80' can have multiple layers formed by stacking a layer that includes Al$_2$O$_3$ and a layer that includes HfO$_2$.

Hereinafter, a semiconductor device according to an exemplary embodiment will be described with reference to FIG. 11 to FIG. 14. FIG. 10, FIG. 11, FIG. 12, and FIG. 13 are cross-sectional views of different semiconductor layers that can be manufactured by a method according loan exemplary embodiment.

Figure 11:
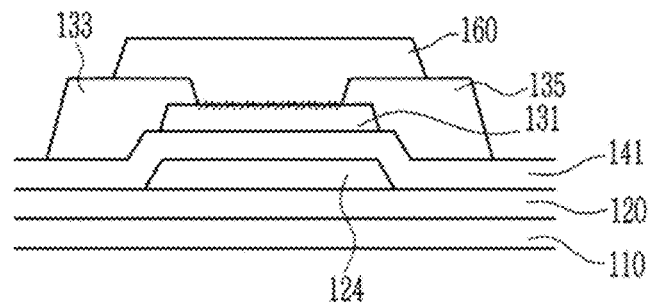
FIG. 11, FIG. 12, FIG. 13, and FIG. 14 are cross-sectional views of different semiconductor devices that can be manufactured by a method according to an exemplary embodiment.

FIG. 11 is a cross-sectional view of a semiconductor device having a bottom-gate structure in which a gate electrode is disposed below a semiconductor layer.

A semiconductor device according to an exemplary embodiment of FIG. 11 includes a substrate 110, a buffer layer 120, a first gate electrode 124, a first gate insulation layer 141, a semiconductor layer 131, a source electrode 133, and a drain electrode 135.

According to an exemplary embodiment, the substrate 110 may include glass or a transparent material that includes Si as a main component. However, embodiments are not limited thereto, and the substrate 110 may include various materials such as transparent plastic or a metal.

According to an exemplary embodiment, the buffer layer 120 is disposed on the substrate 110. The buffer layer 120 prevents diffusion of impurity ions into the semiconductor device and permeation of moisture or air into the semiconductor device, and planarizes a surface of the semiconductor device.

According to an exemplary embodiment, the first gate electrode 124 is disposed on the buffer layer 120. The first gate insulation layer 141 includes an inorganic insulation material such as a silicon nitride (SiN$_x$) or a silicon oxide (SiO$_x$), or an organic insulation material, and is disposed on the first gate electrode 124. The semiconductor layer 131 includes a semiconductor material having a layered structure and is disposed on the first gate insulation layer 141. The semiconductor layer 131 includes at least one of a transition metal chalcogen compound (TMDC), graphene, phosphorous black, etc.

According to an exemplary embodiment, the semiconductor layer 131 has a thickness of less than about 1 nm. In particular, when the semiconductor layer 131 includes a transition metal chalcogen compound (TMDC) the thickness of the semiconductor layer 131 is less than about 0.6 nm.

According to an exemplary embodiment, the semiconductor layer 131 is formed through one of a chemical vapor deposition (CVD) process, a plasma-enhanced chemical vapor deposition (PECVD) process, an atomic layer deposition (ALD) process, or a sputtering process.

According to an exemplary embodiment, the source electrode 133 and the drain electrode 135 are disposed on the semiconductor layer 131.

According to an exemplary embodiment, an interlayer insulation layer 160 is disposed on the source electrode 133 and the drain electrode 135. The interlayer insulation layer 160 covers some exposed portions of the semiconductor layer 131. The interlayer insulation layer 160 protects the semiconductor layer 131.

The interlayer insulation layer 160 according to an exemplary embodiment includes a high dielectric material, and as described above, it can be formed by an ALD method.

According to an exemplary embodiment, the semiconductor layer 131 includes a semiconductor material having a layered structure and has a nano-sized thickness, and is thus easily damaged. In addition, a semiconductor layer 131 has high surface stability and lacks dangling bonds so that it may not be able to adsorb precursors to it's surface.

A semiconductor device according to an exemplary embodiment receives a high precursor injection pressure when an atomic layer deposition method is used, and thus the interlayer insulation layer 160 can be uniformly formed without causing damage to the hatched portion of the semiconductor layer 131.

Hereinafter, in FIG. 12 to FIG. 14, features that differ from those of an exemplary embodiment of FIG. 10 are described, and portions for which the description is omitted follow an above-stated exemplary embodiment.

Figure 12:
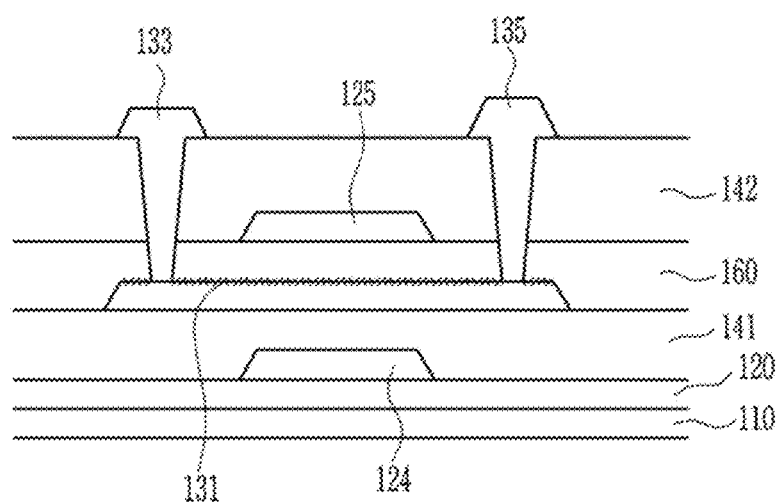

FIG. 12 is a cross-sectional view of a semiconductor device having a dual-gate structure in which two gate electrodes are included in one semiconductor device.

An exemplary embodiment of FIG. 12 further includes a second gate electrode 125 and a second gate insulation layer 142.

According to an exemplary embodiment, an interlayer insulation layer 160 is disposed on a semiconductor layer 131. In a present exemplary embodiment, the semiconductor layer 131 includes a channel region, a source region, and a drain region, and the source and drain regions may be doped with an n-type or p-type impurity.

According to an exemplary embodiment, the second gate electrode 125 is disposed on the interlayer insulation layer 160. The second gate insulation layer 142 is disposed on the second gate electrode 125. In addition, the second gate insulation layer 142 and the interlayer insulation layer 160 have contact holes that penetrate therethrough. A source electrode 133 and a drain electrode 135 are respectively electrically connected to the source region and the drain region of tire semiconductor layer 131 through the contact holes.

In this case, an atomic layer deposition method according to an exemplary embodiment can be used to uniformly form the insulation layer 160 without damaging the hatched portion of tire semiconductor layer 131.

Figure 13:
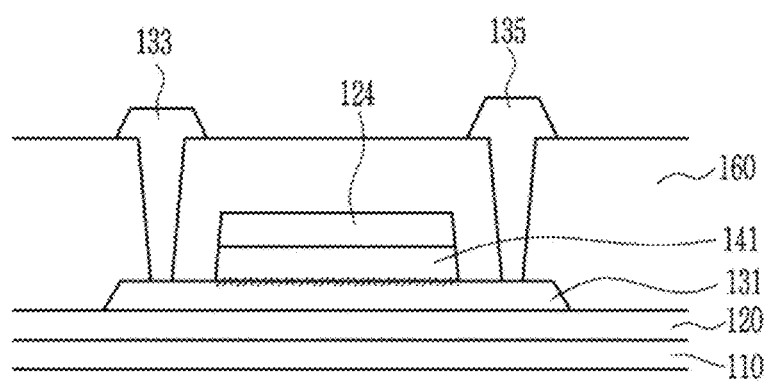

FIG. 13 is a cross-sectional view of a semiconductor device having a top-gate structure in which a gate electrode is disposed above a semiconductor layer.

In an exemplary embodiment of FIG. 13, a semiconductor layer 131 is disposed on a buffer layer 120. A first gate insulation layer 141, a first gate electrode 124, and an interlayer insulation layer 160 are sequentially disposed on the semiconductor layer 131. The interlayer insulation layer 160 includes contact holes. A source electrode 133 and a drain electrode 135 are respectively electrically connected to a source region and a drain region of the semiconductor layer 131 through the contact holes.

In this case, an atomic layer deposition method according to an exemplary embodiment can be used to uniformly form the first gate insulation layer 141 without damaging the hatched portion of the semiconductor layer 131.

Figure 14:
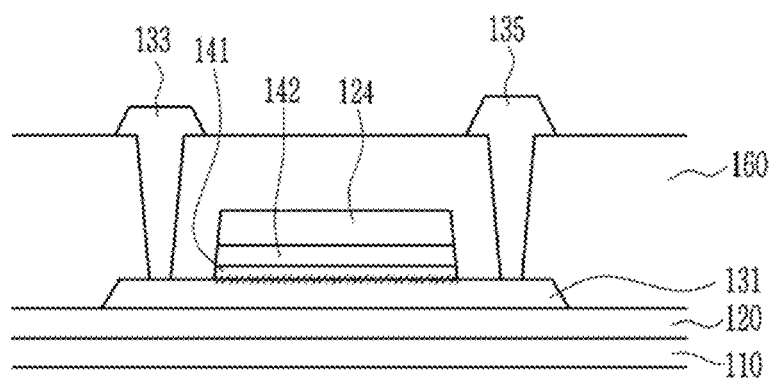

FIG. 14 is a cross-sectional view of a semiconductor device having the same top-gate structure as FIG. 13, in which an insulation layer has multiple layers.

An exemplary embodiment of FIG. 14 further includes a second gate insulation layer 142. The second gate insulation layer 142 is disposed on the first gate insulation layer 141. The first gate insulation layer 141 and the second gate insulation layer 142 include different materials. In a present exemplary embodiment, the gate insulation layer is a double layer, but embodiments are not limited thereto, and the gate insulation layer may include three or more layers.

In this case, an atomic layer deposition method according to an exemplary embodiment can be used to uniformly form the first gate insulation layer 141 without damaging the hatched portion of the semiconductor layer 131.

According to an exemplary embodiment, since the second gate insulation layer 142 is disposed on the first gate insulation layer 141, the second gate insulation layer 142 may be formed not only by an ALD method but also by a chemical vapor deposition (CVD) process, a lower-pressure chemical vapor deposition (LPCVD) process, etc., unlike the first gate insulation layer 141 on the semiconductor layer 131.

Figure 15:
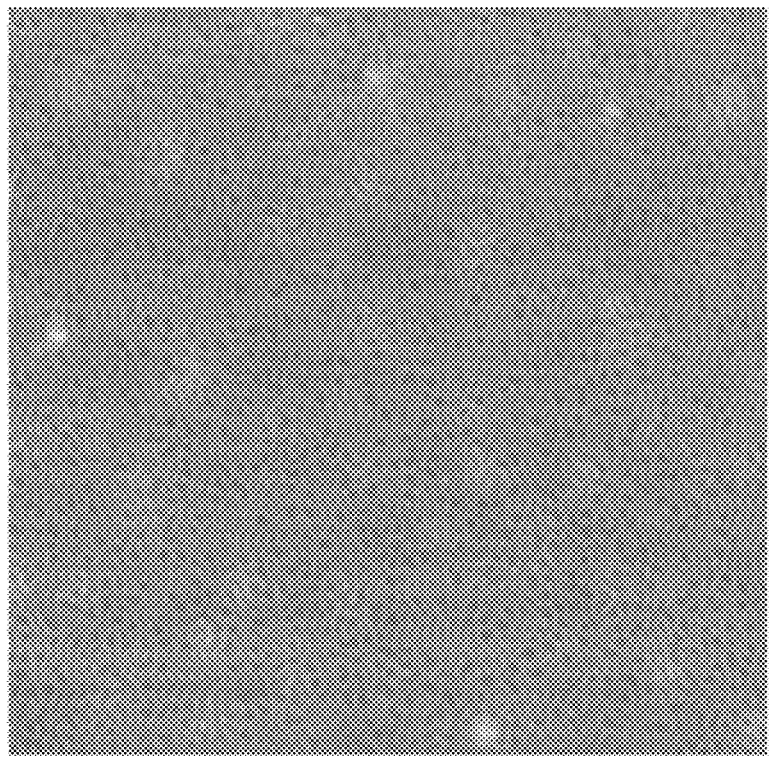
FIG. 15, FIG. 16, and FIG. 17 are atomic force microscopy (AFM) images that show surface roughness of semiconductor layers at different precursor injection pressures.
Figure 16:
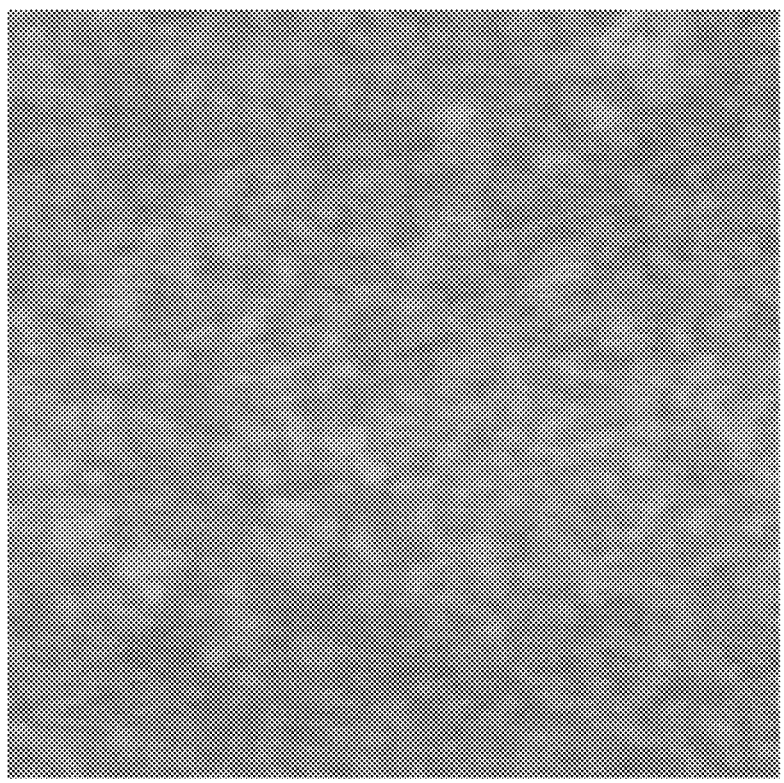
Figure 17:
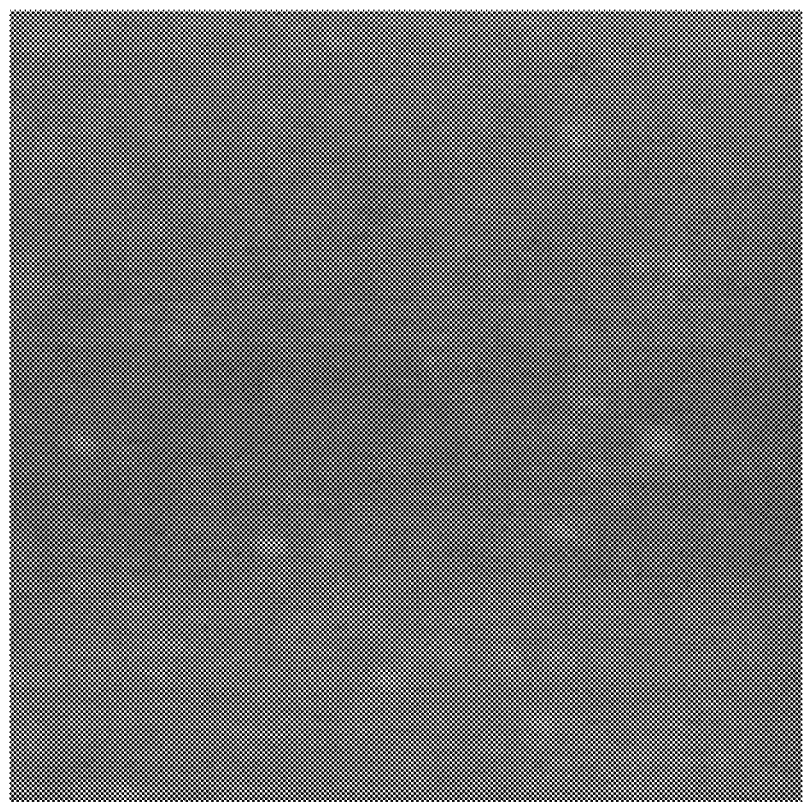

Hereinafter, referring to FIG. 15 to FIG. 17, the degree of uniformity of an insulation layer formed by using an ALD method at different precursor injection pressures will be described. FIG. 15, FIG. 16, and FIG. 17 are atomic force microscopy (AFM) images that depict surface roughness of a semiconductor layer at different precursor injection pressures. Hereinafter, surface roughness is calculated by a root mean square method, which calculates a mean value of values obtained by squaring original values, and then taking a positive square root of the mean value.

More specifically, according to an exemplary embodiment, FIG. 15 to FIG. 17 are AFM images at precursor injection pressures of 0.05 Torr, 0.5 Torr, and 2.5 Torr, respectively, when an ALD method is performed for 9 cycles. In this case, a semiconductor layer includes $MoS_2$, an insulation layer includes $Al_2O_3$, and a precursor includes $AlMe_3$ (TMA). In the Figures, a bright portion denotes a deposition area of an $Al_2O_3$, and a dark portion denotes a non-deposition area of an $Al_2O_3$.

Referring to FIG. 15, when precursors were injected at an injection pressure of 0.05 Torr, $Al_2O_3$ that forms the insulation layer was deposited only on some portions of the surface of the $MoS_2$ semiconductor layer. $Al_2O_3$ was non-uniformly formed at the surface of the semiconductor layer surface, and surface roughness $R_q$ was measured as 2 nm.

The surface roughness is indicative of minute deformations formed due to protrusions and depressions at a surface. In general, surface roughness may be calculated by a curved line that represents a vertical cross-section of a surface to be measured. The surface roughness can be calculated as an arithmetic average of the absolute values of vertical heights of n curved lines (here, n>0) from a center line that indicates an average value of the curved line. In a present exemplary embodiment, the surface roughness is calculated by the root mean square method as described above.

Referring to FIG. 16, according to an embodiment, when the precursors were injected at an injection pressure of 0.5 Torr, bright portions increased compared to FIG. 15. That is, it was determined that $Al_2O_3$ as deposited on a wider area on the surface of the semiconductor layer. It was observed that as the injection pressure increased to 0.5 Torr from 0.05 Torr, an area of the surface of the semiconductor layer on which $Al_2O_3$ was deposited gradually increased. In this case, protrusions and depositions at the surface increased as deposition of $Al_2O_3$ increased such that the surface roughness $R_q$ was measured as 4.1 nm.

Referring to FIG. 17, according to an embodiment, when precursors were injected at an injection pressure of 2.5 Torr, it was observed than $Al_2O_3$ was deposited on almost every area of the surface of the semiconductor layer. Compared to FIG. 15 and FIG. 16, $Al_2O_3$ was densely formed on the surface of the semiconductor layer, and it can be determined that the most uniform thin insulation layer was formed. In this case, the surface roughness was measured as 3.2 nm.

In FIG. 15 to FIG. 17, the surface roughness $R_q$ increased and then decreased as the precursor injection pressure increased, where the number of cycle repetitions was the same. This is because, during a process of depositing the insulation layer to gradually cover the surface of the semiconductor layer, protrusions and depressions of the surface increased until the non-deposited region of the insulation layer was greater than the deposition region, and then the protrusions and depressions of the surface decreased as the deposition region grew to exceed the non-deposited region, as the cycles were repeated. Accordingly, in FIG. 15 to FIG. 17, the surface roughness $R_q$ increased from 2 nm to 4.1 nm and then decreases to 3.2 nm.

In this case, since an injection amount of the precursors is proportional to a product of injection pressure and injection time of the precursors, the injection pressure in FIG. 17 is 2.5 Torr, but when the injection pressure is increased over 2.5 Torr, the surface roughness is reduced to 3.2 nm or less.

Figure 18:
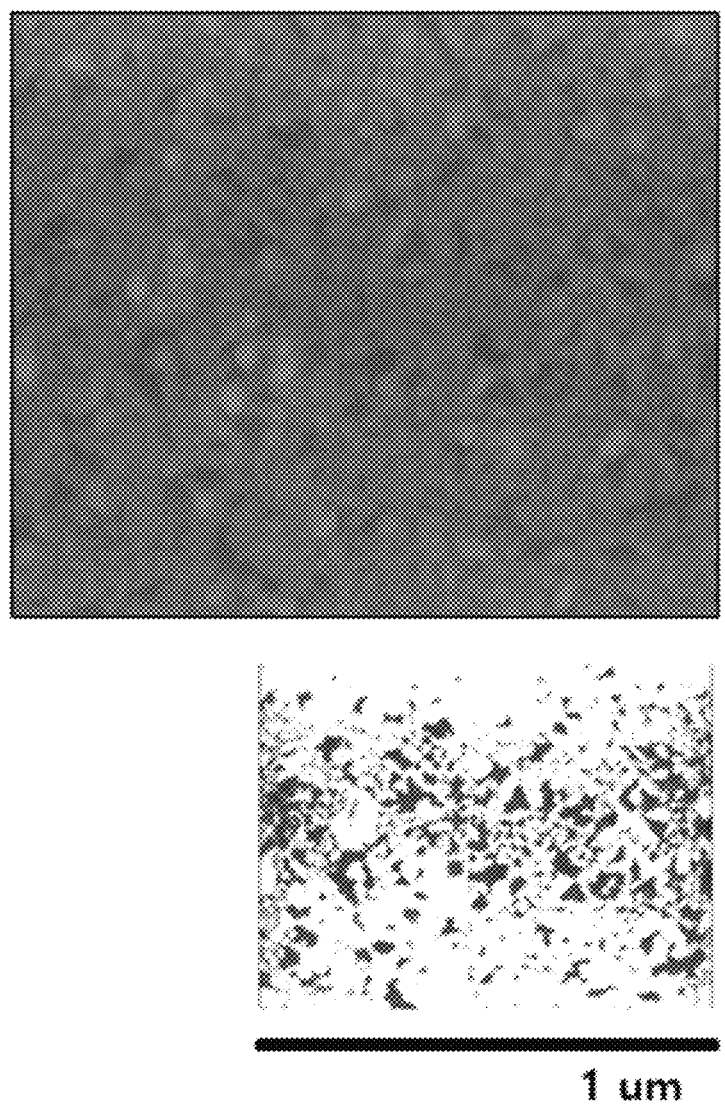
FIG. 18 and FIG. 19 are AFM images and image diagrams that show a deposition degree of an insulation layer at different pressures.
Figure 19:
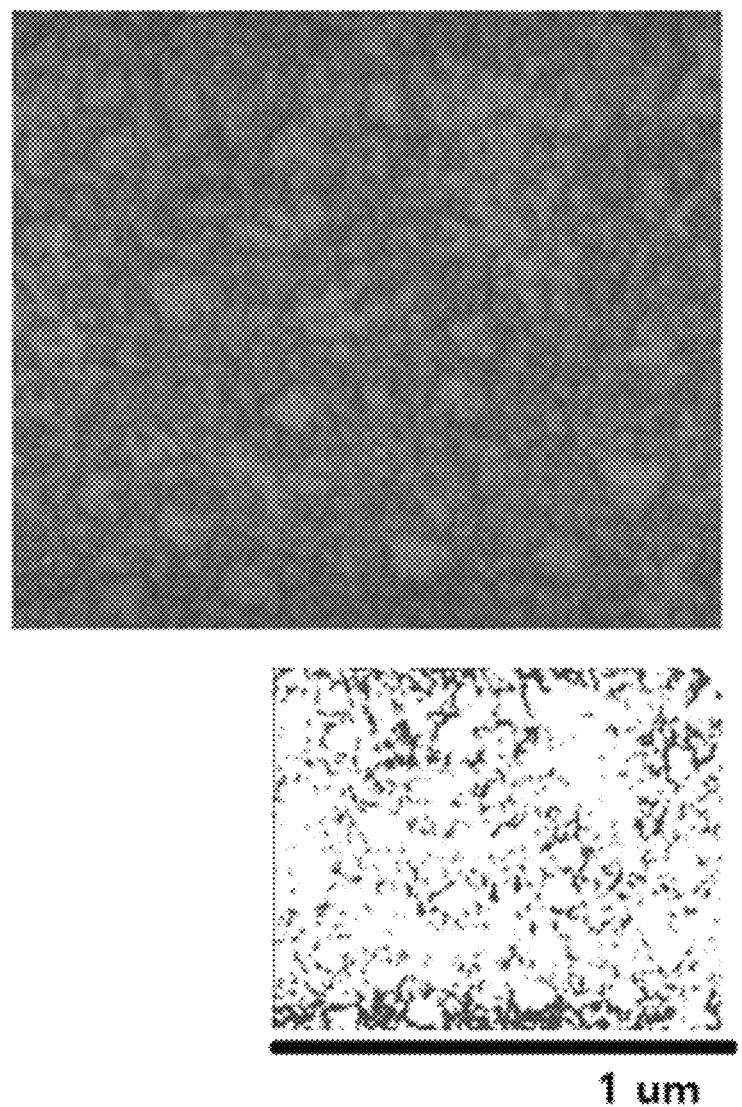

Hereinafter, referring to FIG. 18 and FIG. 19, uniformity of an insulation layer at different pressures under a cycle that is different from that of an exemplary embodiment of FIG. 15 to FIG. 17 will be described. FIG. 18 and FIG. 19 are AFM images and image diagrams that show a deposition degree of an insulation layer at different pressures.

More specifically, FIG. 18 and FIG. 19 show AFM images and image diagrams when an atomic deposition method is carried out with 15 cycles and injection pressures of precursors are 0.05 Torr and 0.5 Torr, respectively.

Hereinafter, only features that differ from those of the exemplary embodiment of FIG. 15 to FIG. 17 are described, and portions for which the description is omitted follow an above-stated exemplary embodiment.

Referring to FIG. 18, according to an embodiment, when the precursor is injected with an injection pressure of 0.05 Torr, $Al_2O_3$ is deposited only on a part of the surface of the semiconductor layer surface. A lower image in FIG. 18 is extracted from the AFM image at the upper image of FIG. 18 by using a specific analysis method. A deposition region of $Al_2O_3$, at the surface of the semiconductor layer surface was measured as 65%.

Referring to FIG. 19, according to an embodiment, when the precursor is injected with an injection pressure of 0.5 Torr, $Al_2O_3$ is deposited on almost the entire region of the surface of the semiconductor layer. Compared to FIG. 18, the deposition region is increased. In the surface of the semiconductor layer, the $Al_2O_3$ deposition region is measured as 90%, and thus, compared to FIG. 18 in which the injection pressure is 0.05 Torr, the insulation layer can be uniformly formed at the surface of the semiconductor layer.

When an exemplary embodiment of FIG. 15 to FIG. 17 and an exemplary embodiment of FIG. 18 and FIG. 19 are compared, as the number of cycle repetitions of the atomic deposition method is small, it can be determined that a high precursor injection pressure enables the uniformity of the insulation layer to saturate. That is, when the injection pressure of the precursor increases according to an exemplary embodiment, the insulation layer can be uniformly deposited with fewer cycles, thereby shortening the processing time and processing cost.

In an exemplary embodiment of FIG. 19, when the atomic deposition method is repeated for 15 cycles, a precursor injection pressure of about 0.5 Torr enables a deposition region to be reach about 90% and thus an insulation layer can be uniformly formed. As the number of cycles is increased, a precursor injection pressure that can assure uniformity in the insulation layer can be decreases, and specifically, when an atomic deposition method is carried out with about 50 cycles, the precursor injection pressure may be about 0.1 Torr. Thus, the precursor injection pressure according to an exemplary embodiment may have a range of from about 0.01 Torr to 100 Torr, and depending on exemplary embodiments, the range may be between about 0.1 Torr and about 10 Torr.

According to an embodiment, a thin, layered semiconductor material has high mobility, a high on/off current ratio, and high stability, and is also flexible and transparent. When a semiconductor layer includes a semiconductor material having a layered structure, a thin insulating layer can be formed on the semiconductor layer. Therefore, a thin film can be formed by an atomic layer deposition process using a precursor.

Since an insulation layer according to an exemplary embodiment has a thickness scale in the order of atomic layer units, the insulation layer can include a high-k material for permittivity and capacitance.

However, a layered semiconductor material has a stable surface, and thus chemical bonding cannot be easily secured between the surface of the semiconductor layer and the precursors, and accordingly, a uniform insulation layer may not form on the semiconductor layer.

Conventionally, in forming an insulation layer on a layered semiconductor layer, damage can be caused to the semiconductor layer or an unnecessary interlayer is introduced.

However, in an embodiment, increasing the injection pressure of the precursor increases the bonding of the precursor to the surface of the semiconductor layer without damaging the semiconductor layer. Accordingly, the precursor, which is a source for forming the insulation layer, is uniformly formed on the surface of the semiconductor layer and the uniformity of the insulation layer formed therefrom can be improved. In addition, since the injection amount of the precursor increases with the injection pressure of the precursor, it is possible to deposit the insulation layer using fewer atomic layer deposition cycles, thereby shortening the processing time and the process cost.

While embodiments of this disclosure have been described in connection with what is presently considered to be practical exemplary embodiments, it is to be understood that embodiments of the disclosure are not limited to exemplary embodiments, but, on the contrary, are intended to cover various modifications and equivalent arrangements included within the spirit and scope of the appended claims.

What is claimed is:

1. A method for manufacturing a semiconductor device, comprising:
    forming a semiconductor layer on a substrate in a chamber; and
    forming an insulation layer on the semiconductor layer, wherein forming the insulation layer comprises:
        (a) it precursors that include a metal and at least one ligand into a surface of the semiconductor layer, wherein the precursor reacts with a hydroxyl group at a surface of the semiconductor layer;
        (b) removing precursors that are not adsorbed onto the semiconductor layer, wherein only portions of the precursor combined with oxygen ions from the hydroxyl group remain on the semiconductor layer;
        (c) injecting reactants onto the surface of the semiconductor layer, wherein the reactants include a first element and a second element; and
        (d) removing residual reactants, wherein only the metals and the first elements that are adsorbed to the surface of the semiconductor layer remain,
    wherein the ligand separates from the precursor,
    the metal of the precursor and the first element of the reactant react with each other, and
    the ligand of the precursor and the second element of the reactant react with each wherein a reaction product is formed,
    wherein the semiconductor layer comprises a semiconductor material that has a layered structure, and
    wherein a density of the precursors adsorbed to the surface of the semiconductor layer is increased by increasing an injection pressure of the precursors, and
    steps (a) to (d) are carried out at a temperature from about 300° C. to about 500° C.

2. The method for manufacturing a semiconductor device of claim 1,
    wherein the semiconductor material comprises at least one of a transition metal dichalcogenide (TMDC), graphene, or black phosphorous,
    wherein the TDMC has a chemical formula of $MX_2$, where M is one of Mo, W, Zr, or Re, and X is one of S, Se, or Te.

3. The method for manufacturing a semiconductor device of claim 1,
    wherein the precursors are injected at a pressure of about 0.01 Torr to about 100 Torr.

4. The method for manufacturing a semiconductor device of claim 1,
    wherein the insulation layer comprises at least one of an oxide represented by one of $M^1_xO_a$ or $M^1_xM^2_yO_a$, a nitride represented by $M^1_xN_b$, or an oxynitride represented by $M^1_xO_aN_b$,
    wherein $M^1$ and $M^2$ are metals, and $x>0$, $y>0$, $a>0$, and $b>0$.

5. The method for manufacturing a semiconductor device of claim 4,
    wherein the precursor comprises the same metal as the metal included in the insulation layer.

6. The method for manufacturing a semiconductor device of claim 5,
    wherein the precursor comprises at least one of $AlCl_3$, $AlMe_2Cl$, $AlMe_2OiPr$, $AlEt_3$, $Al(OnPr)_3$, $Me_3N{:}AlH_3$, $AlMe_2H$, $Me_2EtN{:}AlH_3$, $ZrCl_4$, $ZrI_4$, $ZrCp_2Cl_2$, $Zr(OiPr)_2(dmae)_2$, $Zr(OtBu)_4$, $Zr(NMe_2)_4$, $HfCl_4$, $HfI_4$, $HfCl_2[N(SiMe_3)]_2$, $Hf(OtBu)_4$, $Hf(OtBu)_2(mmp)_2$, $Hf(mmp)_4$, $Hf(ONEt_2)_4$, $Hf(NMe_2)_4$, $Hf(NO_3)_4$, $YCp_3$, $Y(CpMe)_3$, $Y(thd)_3$, $La(thd)_3$, $La[N(SiMe_3)_2]_3$, $TaF_5$, $TaCl_5$, $TaI_5$, $Ta(OEt)_5$, $Ta(OEt)_4(dmae)$, $Ta(NMe_2)_5$, $Ta(NMe_2)_5$, $Ta(NEt)(NEt_2)_3$, $Ta(NEt_2)_5$, $Ta(NtBu)(tBu_2pz)_3$, $Ta(NtBu)(iPrAMD)_2NMe_2$, $MgCp_2$, $Mg(thd)_2$, $ZnCl_2$, $ZnMe_2$, $ZnEt_2$, $Zn(OAc)_2$, $TiCl_4$, $TiI_4$, $Ti(OMe)_4$, $Ti(OiPr)_4$, $SiCl_4$, $SiCl_3H$, $SiCl_2H_2$, $Si(OEt)_4$, HMDSh, $Si(NCO)_4$, $MeOSi(NCO)_3$, $Si_2Cl_6$, or $SiH_4$.

7. The method for manufacturing a semiconductor device of claim 4,
    wherein the insulation layer comprises at least one of $Y_2O_3$, $Ta_2O$, $Ta_2O_5$, ZnO, $Nb_2O_5$, $SiO_2$, TiN, SiN, HfON, SiON, or STO ($SrTiO_3$).

8. The method for manufacturing a semiconductor device of claim 1,
    wherein the insulation layer has a thickness of from about 0.5 nm to about 4 nm.

9. The method for manufacturing a semiconductor device of claim 1,
    wherein the insulation layer comprises at least one atomic layer.

10. The method for manufacturing a semiconductor device of claim 1,
    wherein the semiconductor layer has a thickness of less than about 1 nm.

11. The method for manufacturing a semiconductor device of claim 1,
    wherein the reactant is an oxidizer.

12. The method for manufacturing a semiconductor device of claim 1, wherein
    step (a) comprises adsorbing a metal of the precursor to the surface of the semiconductor layer, and
    step (c) comprises forming the insulation layer on the surface of the semiconductor layer from a reaction between the metal of the precursor and the reactant.

13. The method for manufacturing a semiconductor layer of claim 1, wherein
    a surface roughness of a surface where the semiconductor layer contacts the insulation layer is from about 2 nm to 3.2 nm, and
    the surface roughness is calculated by calculating plurality of absolute values of vertical heights from a center line of n curved lines on the surface, calculating a mean value of squares of the plurality of absolute values, and taking a positive square root of the mean value.

* * * * *